United States Patent [19]

Mantese et al.

[11] Patent Number: 4,952,556

[45] Date of Patent: Aug. 28, 1990

[54] PATTERNING THIN FILM SUPERCONDUCTORS USING FOCUSED BEAM TECHNIQUES

[75] Inventors: Joseph V. Mantese, Washington; Aboud H. Hamdi, Detroit; Adolph L. Micheli, Mt. Clemens; Antonio B. Catalan, Sterling Heights, all of Mich.

[73] Assignee: General Motors Corporation, Detroit, Mich.

[21] Appl. No.: 226,220

[22] Filed: Jul. 29, 1988

Related U.S. Application Data

[63] Continuation-in-part of Ser. No. 130,135, Dec. 8, 1987, abandoned.

[51] Int. Cl.$^5$ .......................... B05D 3/06; B05D 5/12
[52] U.S. Cl. .......................................... 505/1; 427/38; 427/43.1; 427/53.1; 427/62; 427/63; 427/126.3; 427/226
[58] Field of Search .................... 427/62, 63, 38, 43.1, 427/126.3, 226, 53.1; 505/1, 818, 819

[56] References Cited

U.S. PATENT DOCUMENTS

| | | | |
|---|---|---|---|
| 4,239,816 | 12/1980 | Breininger et al. | 427/168 |
| 4,401,474 | 8/1983 | Donley | 427/226 |
| 4,485,094 | 11/1984 | Pebler et al. | 427/226 |

FOREIGN PATENT DOCUMENTS

0292387A2 11/1988 European Pat. Off. .

OTHER PUBLICATIONS

Cody et al., "Rapid Thermal Anneal of Sprayed $Y_1Ba_2Cu_3O_{7-x}$ Slurry", Appl. Phys. Lett., 52(18), May 1988, pp. 1531–1533.
Venkatesan, "Laser Deposited High Tc Superconducting Thin Films", Solid State Technology, Dec. 1987, pp. 39–41.
Gross et al. (I), "A Versatile New Metallo-organic Spin-on Process for Preparing Superconducting Thin Films", MRS, vol. 99, Nov. 1987, pp. 731–734.
Gross et al. (II), "Laser Direct-write Metallization in Thin Palladium Acetate Films", J. Appl. Phys., vol. 61(4), Feb. 1987, pp. 1628–1632.
Davison et al., "High Tc Superconducting Films from Metallo-organic Precursors", MRS, vol. 99, Nov. 1987, pp. 289–292.
Gurvitch et al., "Preparation and Substrate Reaction of Superconducting Y—Ba—Cu—O Films", Appl. Phys. Lett. 51(13), Sep. 1987, pp. 1027–1029.
Koch et al., "Thin Films and Squids made from $YBa_2Cu_3O_y$", MRS ed., Gubser et al., Apr. 1987, (Anaheim, Calif.), pp. 81–84.
Gross, "Laser Direct-write Metallization in Metallo-organic Films", MRS ed., von Gutfeld et al., Dec. 1985, (Boston, Mass.), pp. 21–23.
A. Gupta et al., "Direct Laser Writing of Superconducting Patterns of $Y_1Ba_2Cu_3O_{7-y}$", Applied Physics Letters, vol. 52, No. 8, Feb. 22, 1988, pp. 665–666.
M. K. Wu et al., "Superconductivity at 93K in a New Mixed Phase Y—Ba—Cu—O Compound System at Ambient Pressure", Physical Review Letters, vol. 58, No. 9, Mar. 2, 1987, pp. 908–910.
H. Adachi et al., "Preparation and Characterization of Superconducting Y—Ba—Cu—O Thin Film", Japanese Journal of Applied Physics, vol. 26, No. 5, May 1987, pp. L709–L710.
D. Dijkkamp et al., "Preparation of Y—Ba—Cu Oxide Superconductor Thin Films Using Pulsed Laser Evaporation from High $T_c$ Bulk Material", Applied Physics Letters, vol. 51, No. 8, Aug. 24, 1987, pp. 619–621.
M. E. Gross et al., "Versatile New Metalorganic Process for Preparing Superconducting Thin Films", Applied Physics Letters, vol. 52, No. 2, Jan. 11, 1988, pp. 160–162.
C. E. Rice et al., "Preparation of Superconducting Thin Films of $Ba_2YCu_3O_7$ by a Novel Spin-on Pyrolysis Technique", Applied Physics Letters, vol. 51, No. 22, Nov. 30, 1987, pp. 1842–1844.
D. K. Lathrop et al., "Production of $YBa_2Cu_3O_{7-y}$ Superconducting Thin Films in situ by High Pressure Reactive Evaporation and Rapid Thermal Annealing", Applied Physics Letters, vol. 51, No. 19, Nov. 9, 1987, pp. 1554–1556.
H. G. Craighead et al., "Metal Deposition by Electron Beam Exposure of an Organometallic Film", Applied Physics Letters, vol. 48, No. 25, Jun. 23, 1986, pp. 1748–1750.
L. R. Harriott et al., "Decomposition of Palladium Acetate Films with a Microfocused Ion Beam", Applied Physics Letters, vol. 49, No. 24, Dec. 15, 1986, pp. 1661–1662.

(List continued on next page.)

Primary Examiner—Norman Morgenstern
Assistant Examiner—Roy V. King
Attorney, Agent, or Firm—Domenica N. S. Hartman

[57] ABSTRACT

Patterned films of superconducting materials are formed using focused beam techniques, such as electron beam, ion beam, and laser beam techniques. A solution comprising the neodecanoates of yttrium, barium, and copper is formed which is soluble in an organic solvent. The solution is spun onto an appropriate substrate. The solution is dried and subsequently selectively exposed using focused beam techniques, so that the exposed regions are no longer soluble in the organic solvent. The solution is immersed in the organic solvent, so that the only the exposed, insoluble regions remain on the substrate. The solution is then heated at a temperature sufficient to decompose the neodecanoates, about 500° C., and then heated again, preferably using rapid thermal annealing techniques, to promote recrystallization and grain growth of the remaining metal oxides. The resulting patterned film exhibits superconductive characteristics.

8 Claims, No Drawings

OTHER PUBLICATIONS

S. Matsui et al., "Ion Species Dependence of Focused-Ion-Beam Lithography", *Journal Vacuum Science Technology,* vol. B5, No. 4, Jul./Aug. 1987, pp. 853–857.

S. S. Eskildesn et al., "Inorganic Ion Beam Resist for Additive Plating of Metallic Interconnects", *Applied Physics Letters,* vol. 46, No. 11, Jun. 1, 1985, pp. 1101–1102.

Y. Ohmura et al., "Focused Ion Beam Induced Fine Patterns of Organogold Films", *Applied Physics Letters,* vol. 51, No. 19, Nov. 9, 1987, pp. 1500–1502.

A. Gupta et al., "Laser Writing of Copper Lines from Metalorganic Films", *Applied Physics Letters,* vol. 51, No. 26, Dec. 28, 1987, pp. 2254–2256.

PATTERNING THIN FILM SUPERCONDUCTORS USING FOCUSED BEAM TECHNIQUES

This application is a continuation-in-part of U.S. Ser. No. 130,135, filed in the U.S. on Dec. 8, 1987, now abandoned and entitled "Patterning Thin Film Superconductors Using Focused Beam Techniques."

This invention relates to superconducting materials. More particularly, this invention relates to methods for forming patterned films of superconducting materials.

BACKGROUND OF THE INVENTION

Films of superconducting materials have been formed using metallo-organic deposition techniques. Superconducting films formed by metallo-organic deposition offer many advantages over standard methods for film preparation and deposition. A significant advantage is that the metallo-organic deposition process does not require vacuum processing. In addition, the chemical constituents of the films may be altered with ease.

Examples of such superconducting materials prepared using metallo-organic deposition techniques are disclosed in the previously filed U.S. Ser. No. 186,627, entitled "Formation of Film Superconductors by Metallo-Organic Deposition," assigned to the same assignee of the present application and herein incorporated by reference.

Metallo-organic deposition of the thin film superconductors generally involves a three step process. First, an organic liquid, such as the composition comprising yttrium, barium, and copper neodecanoates disclosed in the previously filed U.S. Ser. No. 186,627, is spin-coated onto a suitable substrate so as to form a film of the metal neodecanoates. The organic film is then heated in air at about 500° C. for about five minutes so as to decompose the neodecanoates to their metal oxides. Lastly, the metal oxide film is annealed so as to promote recrystallization and grain growth within the metal oxides. Preferably a rapid thermal annealing two-step process is used; a first exposure at approximately 850° C. for approximately 60 seconds, followed by a second exposure at approximately 920° C. for approximately 30 seconds.

The resulting empirical composition for the superconducting thin films prepared in accordance with this metallo-organic deposition technique is $Y_1Ba_2Cu_4O_z$, with z ranging between about 6–8. Electrical measurements indicate a superconducting transition temperature of about 90K for these superconducting materials, with the temperature of zero state resistance as high as about 86K.

It is desirable to provide a method for forming patterned films of superconductive material

SUMMARY OF THE INVENTION

It is an object of the present invention to provide patterned films of superconductive material.

It is a further object of this invention to provide a method for forming patterned films of superconductive material.

It is still a further object of this invention that these patterned superconductive films be formed using focused beam techniques.

In accordance with a preferred embodiment of this invention, these and other objects and advantages are accomplished as follows.

We are the first to produce patterned superconductive films using focused beam techniques.

For the first time a method is disclosed for forming patterned superconductive films by first patterning metal neodecanoate organic films which subsequently reduce to superconducting films of YBaCuO, and, second, exposing the neodecanoates comprised within the metallo-organic films to focused beams.

Initially a yttrium, barium, copper neodecanoate solution is spin-coated onto a suitable substrate, much like conventional photoresist is spun onto a silicon wafer. In a preferred embodiment, the solvent within the neodecanoate solution is driven from the organic film by prebaking the film and substrate at a temperature below the decomposition temperature for the metal neodecanoates, about 25–450° C. preferably about 250° C., for a short period of time, about five minutes. The metal neodecanoate organic film is still soluble in a xylene-pyridine solvent solution after this prebaking step. The prebaked metal neodecanoate organic film is then patterned by exposing selected areas of the organic film to focused beams of electrons, ions, or laser light. This exposure renders the metal neodecanoate material insoluble in the xylene-pyridine mixture where the focused beams have impinged upon the metallo-organic film.

The prebaked organic film and substrate is then rinsed in xylene which acts as a developer to remove the unexposed regions of the organic film, so that only those regions of the metal neodecanoate film which have been exposed to the focused beams remain on the substrate. The substrate and patterned metallo-organic film is then heated to approximately 500° C. for about five minutes, so as to fully decompose the metal neodecanoates and leave only the metal oxides on the substrate surface. The metal oxide film is then preferably rapid thermal annealed in an oxygen atmosphere at a first temperature of approximately 850° C. for about 60 seconds and then at a second temperature of approximately 920° C. for about 30 seconds. The resulting patterned material is superconductive.

Other objects and advantages of this invention will be better appreciated from a detailed description thereof, which follows.

DETAILED DESCRIPTION OF THE INVENTION

In the present invention, a metallo-organic solution is prepared using carboxylates, preferably the neodecanoates, of yttrium, barium, and copper. The neodecanoates are preferred over other carboxylates, as they tend to result in films of superior quality. Metallo-organics of yttrium and barium neodecanoates were formed from their metal acetates by reaction with ammonium neodecanoate. The copper metallo-organic was formed by a reaction of copper(II) acetate with tetramethyl ammonium neodecanoate. Several solutions containing the three neodecanoates, of various concentrations, were made by dissolving the three components in a solvent containing appropriate amounts of xylene and pyridine.

The solution, which resulted in the preferred superconductive film composition of $YBa_2Cu_4O_z$, has a ratio of one gram of the combined metal neodecanoates to one milliliter of solvent; e.g., about 100 grams of the metal neodecanoates (about 21 grams of the yttrium neodecanoate, about 46 grams of the barium neodecanoate, and about 33 grams of the copper neodecanoate) were combined with about 100 milliliters of solvent (about 5 to 25 volume percent pyridine in xylene). The usual solvent for the metal neodecanoates is pure xylene; however, it was observed that the yttrium neodecanoate gels in xylene forming an unusable ink. Therefore, the addition of approximately 5 to 25 volume percent, preferably about 20 volume percent, pyridine to the xylene forms a solvent that will not gel the yttrium neodecanoate. The solutions were filtered to remove particles down to approximately 200 nanometers in size.

The solutions prepared from the metal neodecanoates and solvents were flooded onto single crystal strontium titanate (SrTiO$_3$) substrates oriented in the <100> crystal direction. The solutions were spun dry on the substrates at various speeds, ranging between about 1000-10000 revolutions per minute, for an appropriate duration of time.

The xylene-pyridine solvent within the metal neodecanoate solution is driven off from the metal neodecanoate organic film by prebaking the film and substrate in air at a temperature less than the decomposition temperature for the metal neodecanoates; i.e., preferably about 250° C., for a short period of time, preferably about 150° C. for about 15 minutes. This prebaking step is necessary when subsequently patterning in a vacuum with a focused beam; because if the solvent is not driven off, the organic solvent detrimentally interferes with the vacuum process.

After the prebaking step at a temperature less than the metal neodecanoate decomposition temperature, the organic neodecanoate film is still soluble in a xylene-pyridine solvent solution. The prebaked organic neodecanoate film is then patterned, by exposing selected areas of the organic film to focused beams of electrons, ions, or laser light. This exposure renders the material insoluble in the xylene-pyridine mixture where the focused beams have impinged upon the metallo-organic film. It is believed that the energy imparted to the metallo-organic film upon exposure to the focused beam causes the oxygen carbon bonds within the metallo-organics to break down, thereby leaving only the insoluble metal oxide in the exposed regions. However, it is also believed that this breakdown is only partial in the exposed regions; therefore, some of the metallo-organic remains in the exposed regions thereby requiring the subsequent pyrolysis step. Alternatively, it is also believed that the energy imparted during exposure to the focused beam may cause some cross-linking within the hydrocarbon bonds resulting in insoluble material within the exposed regions.

The patterned metallo-organic films are then fully pyrolyzed at about 500° C. for about five minutes so as to fully decompose the metal neodecanoates and leave only the metal oxides on the substrate surface. During this pyrolysis step, the metal neodecanoates remaining after exposure to the focused beams are fully decomposed such that only a film comprising the desired metal oxide constituents remains on the substrate surface.

The metal oxide film is subsequently annealed to promote recrystallization and grain growth. Preferably, the metal oxide film is rapid thermal annealed in flowing oxygen in a two-step process. Rapid thermal annealing raises the temperature of the substrate and patterned film uniformly and almost instantaneously to the desired annealing temperature. Two methods are generally employed for rapid thermal annealing. The first method, which is the method we prefer, comprises heating the material using quartz lamps. The quartz lamps generate extremely large dosages of infrared electromagnetic radiation in the form of light. The substrates and films are heated very rapidly by exposing the substrates to the quartz lamps and electromagnetic radiation. The second method involves placing the substrates and films on a graphite receptacle and exposing the substrates and receptacle to microwaves. The microwaves heat the graphite receptacle which thereby transmits the heat to the substrate and films. This method heats the film and substrate uniformly and quickly.

The films are preferably rapid thermal annealed in flowing oxygen using a two-step process. First, the films are rapid thermal annealed at about 850° C. for about 60 seconds, then immediately cooled to room temperature. A second rapid thermal annealing is performed at about 920° C. for about 30 seconds followed by a rapid cooling to room temperature. It is believed that the first exposure to the lower temperature results in rapid recrystallization within the metal oxides, at the substrate/film interface while the second exposure to the higher temperature results in rapid grain growth. Rapid thermal annealing of the films after pyrolysis resulted in superconductive films characterized by sharp transitions to full superconductivity at temperatures greater than approximately 90K.

We are the first to produce patterned superconductive films using focused beam techniques.

The three focused beam techniques employed to form the patterned superconductive films are electron beam, ion beam and laser beam techniques. An illustrative example of each focused beam technique is described.

ELECTRON BEAM

A metallo-organic solution was prepared using the neodecanoates of yttrium, barium, and copper, although other carboxylates of these materials may also be used. Metallo-organics of yttrium and barium neodecanoates were formed from their metal acetates by reaction with ammonium neodecanoate. The copper metallo-organic was formed by a reaction of copper(II) acetate with tetramethyl ammonium neodecanoate. The metallo-organic solution, which resulted in the preferred superconductive film composition of YBa$_2$Cu$_4$O$_z$, has a ratio of one gram of the combined metal neodecanoates to one milliliter of solvent; e.g., about 100 grams of the metal neodecanoates (about 21 grams of the yttrium neodecanoate, about 46 grams of the barium neodecanoate, and about 33 grams of the copper neodecanoate) combined with about 100 milliliters of solvent (about 5 to 25 volume percent pyridine in xylene).

The metallo-organic solutions were filtered to remove particles down to approximately 200 nanometers in size. The metallo-organic solutions were then flooded onto single crystal strontium titanate (SrTiO$_3$) substrates, oriented in the <100> crystal direction. The solutions were spun dry on the substrates at various speeds, varying between about 1000-10000 revolutions per minute, for an appropriate duration of time. Preferably, for the electron beam patterning techniques, a spin speed of about 2000 revolutions per minute for a duration of about 30 seconds was used. This combination of spin speed and duration results in a preferred film thickness of about 4.4 micrometers, after the prebaking step.

The xylene-pyridine solvent within the metal neodecanoate solution is driven off from the metallo-organic film by prebaking the film and substrate in air at a temperature less than the decomposition temperature for the metal neodecanoates (i.e., about preferably 250°

C.) for a short period of time. A preferred prebaking step is about 150° C. for about 15 minutes. This prebaking step is necessary since the electron beam patterning is accomplished in a vacuum, and if the solvent was not removed it would detrimentally interfere with the vacuum processing. As stated previously, this results in a film thickness of about 4.4 micrometers.

Using electron beam techniques, selected areas of the prebaked metallo-organic neodecanoate organic films are then exposed in a vacuum to a focused electron beam having an energy ranging between about 20–50 keV, preferably about 25 keV. The diameter of the focused electron beam may vary between about 5–500 nanometers, with a preferred spot size being about 250 nanometers. In addition, the preferred dose is about 1200 micro-Coulombs per square centimeter. Using the preferred beam parameters, a line width of approximately five micrometers is produced, as measured after the subsequent pyrolysis and rapid thermal annealing steps were completed. By varying the parameters, superconducting patterns of various dimensions may be obtained. It is believed that superconductive lines of smaller dimensions may be obtained by optimizing the operating parameters.

The focused electron beam does not scan the selected regions of the metallo-organic film continuously, but rather dwells at selected points in close proximity for brief durations, i.e., microseconds. Therefore, the focused electron beam moves from point to point, creating the patterned image by exposing each of the selected points to the electron beams for a brief duration.

The electron beam renders the exposed regions of the metallo-organic film insoluble in the xylene-pyridine solvent solution The substrate and metallo-organic film, which has been selectively exposed to the focused electron beam, are then rinsed in xylene for about 30 seconds. A visual check reveals that significantly all of the unexposed regions are removed by the xylene at about 30 seconds. The xylene acts analogously to a developer in photoresist technology by removing the unexposed regions of the organic film. Therefore, only the selectively exposed portions of the metal neodecanoate organic film remain on the substrate.

The patterned metallo-organic film is then fully pyrolyzed in air at about 500° C. for about five minutes, so as to fully decompose the metal neodecanoates and leave only the metal oxides on the substrate surface. Complete decomposition of the combined neodecanoates occurs at about 450° C. The pyrolyzed metal oxide film is subsequently annealed to promote recrystallization and grain growth. Preferably, the patterned films are rapid thermal annealed in flowing oxygen using a two-step process. First, the films are rapid thermal annealed at approximately 850° C. for about 60 seconds and rapidly cooled to room temperature, and then rapid thermal annealed at approximately 920° C. for about 30 seconds. This two-step method is preferred, since it is believed that the exposure to the first temperature promotes rapid recrystallization, while the exposure to the second higher temperature promotes rapid grain growth. However, although this two-step rapid thermal annealing method is the preferred method for annealing these films, alternative methods may also be used, such as conventionally annealing in an oxygen atmosphere at about 850–1000° C. for a duration ranging between instantaneous to about 60 minutes, to promote recrystallization and grain growth.

The resulting patterned material is superconductive and has a preferred relative metal composition of $YBa_2Cu_4O_z$, with z ranging between about 6–8. Using the preferred two-step rapid thermal annealing method, a superconducting transition temperature greater than approximately 90K is consistently observed, as determined by four-probe resistance versus temperature measurements, with a zero-resistance temperature of about 69K.

ION BEAM

The metallo-organic films may also be patterned using ion beam methods. The focused ion beam generally requires shorter exposure times and lower ion dosages, as compared to exposing the material using focused electron beam methods, because the ions have a greater mass than the electrons, and therefore impart more energy to the film.

Metallo-organic solutions are prepared using preferably the neodecanoates of yttrium, barium, and copper, although other carboxylates of these metals may also be used. Metallo-organics of yttrium and barium neodecanoates were formed from their metal acetates by reaction with ammonium neodecanoate. The copper metallo-organic was formed by a reaction of copper(II) acetate with tetramethyl ammonium neodecanoate. Several solutions containing the three neodecanoates of various concentrations were made by dissolving the three components in a solvent containing appropriate amounts of xylene and pyridine.

The solution, which resulted in the preferred superconductor film composition of $YBa_2Cu_4O_z$, has a ratio of one gram of the combined metal neodecanoates to one milliliter of solvent; e.g., about 100 grams of the metal neodecanoates (about 21 grams of the yttrium neodecanoate, about 46 grams of the barium neodecanoate, and about 33 grams of the copper neodecanoate) were combined with about 100 milliliters of solvent (about 5 to 25 volume percent pyridine in xylene). The usual solvent for the metal neodecanoates is pure xylene; however, it was observed that the yttrium neodecanoate gels in xylene forming an unusable ink. The solutions were filtered to remove particles down to approximately 200 nanometers in size.

The solutions prepared from the metal neodecanoates and solvents were flooded onto single crystal strontium titanate ($SrTiO_3$) substrates, oriented in the <100> crystal direction. The solutions were spun dry on the substrates at various speeds, varying between about 1000–10000 revolutions per minute, for an appropriate duration of time. For the ion beam patterning techniques, a spin rate of approximately 7000 revolutions per minute was preferred for about 30 seconds. This resulted in a preferred film thickness, after the subsequent prebake step of about 2.6 micrometers. This thickness was preferred because the if the film is too thick, it prevents transmission of the ion beams through the entire metallo-organic film. Therefore, it is desirable to keep the film thickness less than about 3 micrometers when using a focused ion beam for patterning. Thicker films may be patterned using the ion beam techniques; however, the resolution of the patterned lines is sacrificed because of the intense energy required.

The xylene-pyridine solvent within the metal neodecanoate solution is driven off from the metallo-organic film by prebaking the film and substrate in air at a temperature less than the decomposition temperature for the metal neodecanoates; i.e., preferably about 750°

C., for a short period of time, preferably about 150° C. for about 15 minutes. This prebaking is necessary so that the organic solvent does not detrimentally effect the vacuum process. As stated above, this results in a preferred film thickness of about 2.6 micrometers.

After the metal neodecanoate organic films have been prebaked, so as to drive off the organic xylene-pyridine solvent solution, the films may be patterned using a focused ion beam. Generally, any ion forming element may be used to form the focused ion beam, so as to pattern the metallo-organic films. However, the preferred focused ion beams for patterning these metal neodecanoate films are oxygen ($O^+$ or $O^{++}$), gallium ($Ga^+$), boron ($B^+$ or $B^{++}$), phosphorus ($P^+$ or $P^{++}$), or silicon ($Si^+$ or $Si^{++}$).

A focused oxygen ($O^{++}$) ion beam was used in a vacuum with the following processing parameters to obtain a patterned line width of about 10 micrometers in a preferred embodiment. The oxygen ion beam energy may vary between about 10-400 keV, with about 400 keV being preferred to ensure that enough energy is being transmitted to the metallo-organic films. The ion dosage may vary between about $10^{13}$-$10^{16}$ ions per square centimeter, with a preferred dosage more particularly ranging between about $1-5 \times 10^{14}$ ions per square centimeter. The focused ion beam diameter may vary between about 5-1000 nanometers, depending on the desired geometry a beam diameter of up to about one centimeter may be used when an overlaying shadow mask is used to pattern the underlying metallo-organic film. The shadow mask defines the desired configuration to be formed of the metallo-organic films. A smaller diameter beam may be used if the material is being patterned without an overlaying shadow mask, or with a shadow mask having finer dimensions. The scanning speed of the focused ion beam during patterning may range between about 480-4800 inches per second depending on the desired configuration. The ion beam processing parameters may be varied to produce a desired configuration.

The oxygen ion beam which exposes selected regions of the metallo-organic film energizes the exposed metallo-organic material and renders the exposed material insoluble in xylene or the xylene-pyridine solvent solution used to form the metallo-organic solution. Although other suitable solvents which preferentially dissolve the unexposed regions of the substrate while ignoring the exposed regions may also be used. Therefore, the substrate having the metallo-organic film is developed by rinsing in xylene for approximately 30 seconds. Those selected areas that have been exposed to the focused ion beam are insoluble in the xylene, and, hence, the unexposed regions are rinsed away. Therefore, similarly to the electron beam method disclosed above, only those areas which have been exposed to the focused beam remain on the substrate. After rinsing in the xylene, only the selectively exposed portions of the metallo-organic film remain on the substrate.

The substrate and patterned metal neodecanoate organic film is then fully pyrolyzed by placing the substrate in an oven which slowly heats to about 500° C., so as to fully decompose the neodecanoates. A preferred method for pyrolyzing the films after exposure to the focused ion beam is to place the substrate in an oven preheated to about 200° C. and slowly; i.e., approximately 1° C. per minute, ramp the temperature up to about 500° C. and soak at that temperature for about five minutes. This is a preferred method for pyrolysis after ion beam exposure, since it was determined that the exposure to the ion beam excessively hardens the exposed regions, and a slow heating cycle like the one described reduces the thermal stresses and prevents surface cracking due to gas evolution within the material associated with the thermal shock. Complete decomposition of the metal neodecanoates occurs at about 450° C. Therefore, only the metal oxides of appropriate composition remain on the substrate surface after the pyrolysis step.

The pyrolyzed metal oxide film is subsequently annealed in an oxygen atmosphere at about 850-1000° C. for a duration ranging between instantaneous up to about 60 minutes. Preferably, the films are rapid thermal annealed in flowing oxygen using a two-step process. First, the metal oxide films are exposed to a first temperature of about 850° C. for about 60 seconds and cooled to room temperature; then exposed to a second temperature of about 920° C. for about 30 seconds and rapidly cooled to room temperature. It is believed that the exposure to the lower first temperature promotes rapid recrystallization within the metal oxides at the substrate/film interface, while the exposure to the second higher temperature promotes rapid grain growth. The resulting patterned film is superconductive and has a preferred relative metal composition of $YBa_2Cu_4O_z$, with z ranging between about 6-8. The patterned films have a superconducting transition temperature of greater than about 90K and a zero point resistance temperature of about 69K, as determined by four-point probe versus temperature measurements.

LASER BEAM

The third method which is disclosed for forming patterned superconductive films involves laser beam techniques. The prebaked metallo-organic films, which have been spun onto an appropriate substrate, such as strontium titanate, are patterned using laser beam methods. The focused laser beam exposes selective regions of the metal neodecanoate film by imparting energy to the selected regions of the material and rendering that material insoluble in the organic xylene-pyridine solvent solution. An advantage of the laser beam method is that the focused laser beam may locally heat the desired areas above the metal neodecanoate decomposition temperature of about 450° C., so as to pyrolyze the metallo-organics while patterning, therefore eliminating the pyrolysis step required after patterning with either the focused electron beam or ion beam.

A metallo-organic solution is prepared using the carboxylates, preferably the neodecanoates, of yttrium, barium, and copper. Metallo-organics of yttrium and barium neodecanoates were formed from their metal acetates by reaction with ammonium neodecanoate. The copper metallo-organic was formed by a reaction of copper(II) acetate with tetramethyl ammonium neodecanoate. Several solutions containing the three neodecanoates, of various concentrations, were made by dissolving the three components in a solvent containing appropriate amounts of xylene and pyridine.

The solution, which resulted in the preferred superconductor film composition of $YBa_2Cu_4O_z$, has a ratio of one gram of the combined metal neodecanoates to one milliliter of solvent; e.g., about 100 grams of the metal neodecanoates (about 21 grams of the yttrium neodecanoate, about 46 grams of the barium neodecanoate, and about 33 grams of the copper neodecanoate) were combined with about 100 milliliters of solvent (about 5 to 25 volume percent pyridine in xylene). The usual solvent for the metal neodecanoates is pure xylene; however, it was observed that the yttrium neodecanoate gels in xylene forming an unusable ink. The solutions were filtered to remove particles down to approximately 200 nanometers in size. The solutions prepared from the metal neodecanoates and solvents were flooded onto single crystal strontium titanate ($SrTiO_3$) substrates, oriented in the <100> crystal direction. The solutions were spun-dry on the substrates at various speeds, ranging between about 1000–10000 revolutions per minute, for an appropriate duration of time. A spin speed of approximately 1000 revolutions per minute for a duration of approximately 30 seconds resulted in a desirable film thickness of approximately 3.5 micrometers after the subsequent prebaking step. This thickness is desirable since a film of this thickness permits maximum absorption of the laser energy without detriment to the underlying substrate and facilitates good pattern resolution.

The xylene-pyridine solvent within the metal neodecanoate solution is driven off from the metal neodecanoate organic film by prebaking the film and substrate in air at a temperature less than the decomposition temperature for the metal neodecanoates; i.e., preferably about 250° C., for a short period of time, preferably about 150° C. for about 15 minutes. This prebaking step, although desirable because it results in good film consistency, is not necessary since the laser patterning process does not necessarily occur in a vacuum.

After the metallo-organic films have been prebaked at a temperature less than the metal neodecanoate decomposition temperature so as to drive off the organic xylene-pyridine solvent solution, the films are patterned by exposing the selected areas of the film with photons generated from a focused laser beam. The metallo-organics are exposed to the focused laser beam, preferably while in an oxygen atmosphere of about 1 atmosphere pressure. It has been determined that if there is not enough oxygen present during the laser beam patterning, such as when the laser patterning is accomplished in an air environment, there is insufficient oxygen available for formation of the appropriate metal oxides. Therefore, the laser patterning is done in an oxygen-rich environment so as to ensure that the appropriate metal oxides are formed.

Preferably, the focused argon laser beam emits a wavelength of about 514.5 nanometers and has a beam diameter of about 100–10000 nanometers, approximately 6000 nanometers being most preferred, and a beam energy of about 0.1–100 Watts depending on the desired configuration. The preferred photon dosage is approximately 42 kilojoules per square centimeter but may vary depending on the desired pattern. The scanning speed of the focused laser beam operating at these parameters was approximately 32 micrometers per second. This speed may be varied; however, this speed optimized the patterning resolution while avoiding any detrimental effects to the substrate.

The focused laser beam renders those selective areas that have been exposed to the focused laser beam insoluble in the xylene/pyridine solvent solution. Further, depending on the parameters of the laser beam employed, those selected areas will also be locally cured if the laser beam imparts enough localized heat to raise the temperature of the film above the metal neodecanoate decomposition temperature, which is about 450° C. This eliminates the need for the subsequent pyrolysis step, which is necessary for the electron beam and ion beam methods.

After the metal neodecanoate films have been exposed to the focused laser beam, the substrate and film are preferably rinsed in xylene or any other suitable organic solvent which will preferentially dissolve the unexposed regions while ignoring the exposed regions, for about 30 seconds. The xylene acts analogously to a developer to remove the unexposed regions of the organic film. The rinsing step occurs regardless of whether the exposed areas had been heated above the metal neodecanoate decomposition temperature. After rinsing in the xylene, only the selectively exposed, insoluble portions of the organic neodecanoate film remain on the substrate.

The substrate and patterned metal neodecanoate organic film are then fully pyrolyzed at approximately 500° C. for about five minutes, so as to fully decompose the metal neodecanoates. The pyrolyzing step is optional depending on whether the focused laser beam parameters were such that complete decomposition of the metal neodecanoates did occur. After decomposition of the metal neodecanoates, whether by the focused laser beam or subsequent curing step, only the metal oxides remain on the substrate surface.

The pyrolyzed metal oxide film is subsequently annealed to promote recrystallization and grain growth in an oxygen atmosphere at about 850–1000° C. for a duration ranging from instantaneous to about 60 minutes. Preferably, the above-described two-step process is used wherein the films are rapid thermal annealed in flowing oxygen. First, the metal oxide film is exposed to approximately 850° C. for about 60 seconds and followed by cooling to room temperature, then exposed to approximately 920° C. for about 30 seconds and cooled to room temperature.

The resulting patterned film may be configured to have any dimension by optimizing the processing parameters for the laser. With the above-described processing parameters, line widths of approximately 3.5 micrometers were obtained. The films were characterized by a superconducting transition temperature of greater than about 90K and a zero resistance temperature of about 69K, as determined by four-point probe versus temperature measurements. The films have a preferred relative metal composition of $YBa_2Cu_4O_z$, with z ranging between about 6–8.

With this invention, superconducting thin films of various compositions may be formed. This invention readily facilitates modification of the focused beam parameters, metal constituents, and their ratios within the thin films and patterned configurations to obtain the optimal superconducting film characteristics. While our invention has been described in terms of preferred embodiments, it is apparent that other forms could be adopted by one skilled in the art, such as substituting the strontium titanate substrate with substrates of barium titanate, sapphire, or silicon/silicon oxide with the appropriate diffusion barrier, or substituting the metal neodecanoates and their ratios with other materials. It is also foreseeable that laser techniques could be used exclusively to promote recrystallization and grain growth within the metal oxide films, instead of the rapid thermal annealing steps now preferred. Accordingly, the scope of our invention is to be limited only by the following claims.

The embodiments of the invention in which an exclusive property or privilege is claimed are defined as follows:

1. A method for producing patterned films of superconductor materials comprising the steps of:
   preparing a solution from the neodecanoates of yttrium, barium, and copper, said metals form an oxide mixture exhibiting superconductive properties characterized by a ratio of yttrium to barium to copper of approximately 1:2:4, said solution comprising up to approximately 25 volume percent pyridine in xylene;
   depositing a film of said solution onto a substrate;
   exposing selective regions of said film to an electron beam in a substantially vacuum environment so that said exposed regions of said film become insoluble in a second organic solvent, said electron beam being focused to a beam diameter ranging between about 5 to 500 nanometers and an energy level ranging between about 20-50 keV, said electron beam emitting a dose of about 1200 microCoulombs per square centimeter;
   immersing said film into said second organic solvent so that said insoluble, exposed regions of said film remain on said substrate, said second organic solvent comprising primarily xylene;
   heating said film to a temperature of approximately 500° C. for a duration of approximately 5 minutes sufficient to thermally decompose said metal neodecanoates into a film containing metal oxides, but insufficient to significantly recrystallize said oxides; and
   heating said oxide film at a second temperature ranging between about 850° C. to about 1000° C. for a duration of up to about 60 minutes that is sufficient to promote recrystallization and grain growth of said metal oxides within said film and induce a change therein by which said film exhibits superconducting properties.

2. A method for producing patterned films of superconductor materials as recited in claim 1 wherein:
   said heating at said second temperature is at a temperature of approximately 850° C. for a duration of about 60 seconds sufficient to promote rapid recrystallization within said film and followed by a cooling of said film to room temperature; and
   further comprising heating said oxide film at a third temperature of about 920° C. for a duration of of about 30 seconds sufficient to promote rapid grain growth within said oxide film.

3. A method for producing patterned films of superconductor materials comprising the steps of:
   preparing a solution from the neodecanoates of yttrium, barium, and copper, said metals form an oxide mixture exhibiting superconductive properties characterized by a ratio of yttrium to barium to copper of approximately 1:2:4, said solution comprising up to approximately 25 volume percent pyridine in xylene;
   depositing a film of said solution onto a substrate;
   exposing selective regions of said film to an ion beam in a substantially vacuum environment so that said exposed regions of said film become insoluble in a second organic solvent, said ion beam being generated from the group consisting of the elements oxygen, gallium, boron, phosphorus and silicon and having a beam diameter ranging from about 5 to about 1000 nanometers, an energy value ranging between about 10 to about 400 keV, and an ion dosage of about $10^{13}$ to about $10^{16}$ ions per square centimeter;
   immersing said film into said second organic solvent so that said insoluble, exposed regions of said film remain on said substrate, said second organic solvent comprising essentially xylene;
   heating said film at a temperature of about 500° C. for a duration of approximately five minutes sufficient to thermally decompose said metal neodecanoates into a film containing metal oxides, but insufficient to significantly recrystallize said oxides; and
   heating said oxide film at a second temperature ranging between about 850° C. to about 1000° C. for a duration of up to about 60 minutes sufficient to promote recrystallization and grain growth of said metal oxides within said film and induce a change therein by which said film exhibits superconducting properties.

4. A method for producing patterned films of superconductor materials as recited in claim 3 wherein:
   said heating at said second temperature is at a temperature of about 850° C. for a duration of about 60 seconds sufficient to promote rapid recrystallization within said film followed by cooling of said film to room temperature; and
   further comprising heating said oxide film at a third temperature of about 920° C. for a duration of about 30 seconds sufficient to promote rapid grain growth within said oxide film.

5. A method for producing patterned films of superconductor materials comprising the steps of:
   preparing a solution from the neodecanoates of yttrium, barium, and copper, said metals form an oxide mixture exhibiting superconductive properties and characterized by a ratio of yttrium to barium to copper of 1:2;4, said solution comprising up to approximately 25 volume percent pyridine in xylene;
   depositing a film of said solution onto a substrate;
   exposing selective regions of said film to a laser beam in an oxygen-rich environment so that said exposed regions of said film become insoluble in a second organic solvent, said laser beam being having a beam diameter of approximately 6000 nanometers and emitted at approximately 515 nonometers wavelength from an argon laser source and an energy value ranging between about 0.1 to about 100 Watts;
   immersing said film into said second organic solvent so that said insoluble, exposed regions of said film remain on said substrate, said second organic solvent comprises essentially xylene;
   heating said film at a temperature of about 500° C. for a duration of approximately 5 minutes sufficient to thermally decompose said metal neodecanoates into a film containing metal oxides, but insufficient to significantly recrystallize said oxides; and
   heating said oxide film at a second temperature ranging between about 850° C. to about 1000° C. for a duration of up to about 60 minutes sufficient to promote recrystallization and grain growth of said metal oxides within said film and induce a change therein by which said film exhibits superconducting properties.

6. A method for producing patterned films of superconductor materials as recited in claim 5 wherein:

said heating at said second temperature is at approximately 850° C. for a duration of about 60 seconds sufficient to promote rapid recrystallization within said film followed by cooling of said film to room temperature; and further comprising heating said oxide film at a third temperature of approximately 920° C. for a duration of about 30 seconds sufficient to promote rapid grain growth within said oxide film.

7. A method for producing patterned films of superconductor materials comprising the steps of:

preparing a solution from the neodecanoates of yttrium, barium, and copper, said metals form an oxide mixture exhibiting superconductive properties characterized by a ratio of yttrium to barium to copper of 1:2:4, said solution comprising up to approximately 25 volume percent pyridine in xylene;

depositing a film of said solution onto a substrate;

exposing selective regions of said film to a laser beam in an oxygen-rich environment, said laser beam operating at a temperature above approximately 450° C. but less than approximately 850° C. for a duration sufficient to thermally decompose said metal neodecanoates into a film containing metal oxides, so that said exposed regions of said film become insoluble in a second organic solvent, said laser beam being focused to a beam diameter of about 6000 nanometers and emitted at approximately 515 nanometers wavelength from an argon laser source and an energy value ranging between about 0.1 to about 100 watts;

immersing said film into said second organic solvent so that said insoluble, exposed regions of said film remain on said substrate, said second organic solvent comprising essentially xylene; and heating said oxide film at a second temperature ranging between about 850° C. to about 1000° C. for a duration of up to approximately 60 minutes sufficient to promote recrystallization and grain growth of said metal oxides within said film and induce a change therein by which said film exhibits superconducting properties.

8. A method for producing patterned films of superconductor materials as recited in claim 7 wherein:

said heating at said second temperature is at approximately 850° C. for a duration of about 60 seconds sufficient to promote rapid recrystallization within said film and followed by cooling said film to room temperature; and further comprising heating said oxide film at a third temperature of about 920°C. for a duration of about 30 seconds sufficient to promote rapid grain growth within said oxide film.

* * * * *